(12) United States Patent
Struble (10) Patent No.: US 12,323,113 B2
(45) Date of Patent: Jun. 3, 2025

(54) CIRCUIT AND METHOD OF SHUTDOWN FOR BIAS NETWORK IN HIGH VOLTAGE AMPLIFIER

(71) Applicant: MACOM Technology Solutions Holdings, Inc., Lowell, MA (US)

(72) Inventor: Wayne Mack Struble, Franklin, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 677 days.

(21) Appl. No.: 17/456,781

(22) Filed: Nov. 29, 2021

(65) Prior Publication Data

US 2023/0170857 A1 Jun. 1, 2023

(51) Int. Cl.
| | |
|---|---|
| *H03F 3/24* | (2006.01) |
| *H03F 1/02* | (2006.01) |
| *H03F 1/22* | (2006.01) |
| *H03F 3/195* | (2006.01) |

(52) U.S. Cl.
CPC ........... *H03F 3/245* (2013.01); *H03F 1/0205* (2013.01); *H03F 1/223* (2013.01); *H03F 3/195* (2013.01); *H03F 2200/451* (2013.01)

(58) Field of Classification Search
CPC ........ H03F 3/245; H03F 1/0205; H03F 1/223; H03F 3/195; H03F 2200/451; H03F 2203/7206; H03F 1/0266; H03F 2203/7227; H03F 3/211; H03F 3/72; H03F 1/523
USPC ....................................................... 330/296
See application file for complete search history.

(56) References Cited

U.S. PATENT DOCUMENTS

| | | | |
|---|---|---|---|
| 2005/0077965 A1 | 4/2005 | Li | |
| 2016/0056765 A1 | 2/2016 | Kim et al. | |
| 2019/0068137 A1* | 2/2019 | Wang | H03F 1/52 |
| 2022/0302881 A1* | 9/2022 | Thomas | H03F 3/211 |
| 2022/0321062 A1 | 10/2022 | Struble | |
| 2023/0032852 A1* | 2/2023 | Wang | H02H 11/002 |

FOREIGN PATENT DOCUMENTS

| | | |
|---|---|---|
| EP | 3477861 A1 | 5/2019 |
| GB | 2572711 A | 10/2019 |

OTHER PUBLICATIONS

U.S. Appl. No. 17/219,118, filed Mar. 31, 2021, titled "High Voltage Stacked Transistor Amplifier" by Wayne Mack Struble.

* cited by examiner

*Primary Examiner* — Andrea Lindgren Baltzell
*Assistant Examiner* — Jose E Pinero
(74) *Attorney, Agent, or Firm* — Robert D. Atkins; PATENT LAW GROUP: Atkins and Associates, P.C.

(57) ABSTRACT

A power amplifier has an amplifier cell with an input terminal receiving an input signal and an output terminal providing an output signal. A bias network is coupled to the output terminal of the amplifier cell to provide a bias signal to the amplifier cell. A shutdown circuit is coupled to the bias network to disable the bias network in response to the input signal. The shutdown circuit has a transistor with a first conduction terminal coupled to the bias network, a second conduction terminal coupled to a power supply terminal. The shutdown circuit further has a first resistor with a first terminal coupled to the input terminal, and a second resistor with a first terminal coupled to a second terminal of the first resistor at a node, and a second terminal coupled to the power supply terminal. The control terminal of the transistor is coupled to the node.

23 Claims, 11 Drawing Sheets

CIRCUIT AND METHOD OF SHUTDOWN FOR BIAS NETWORK IN HIGH VOLTAGE AMPLIFIER

FIELD OF THE INVENTION

The present invention relates in general to semiconductor devices and, more particularly, to a power amplifier and method of forming a shutdown circuit for a bias network in a high voltage amplifier.

BACKGROUND

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and oxide semiconductor field effect transistor (MOSFET). Integrated semiconductor devices typically contain hundreds to millions of electrical components. Examples of integrated semiconductor devices include microcontrollers, microprocessors, and various analog and digital circuits.

Semiconductor devices perform a wide range of functions, such as signal processing, high-speed calculations, transmitting and receiving electromagnetic signals, controlling electronic devices, transforming sunlight to electricity, and power amplification. Semiconductor devices are found in the fields of communications, power conversion, networks, computers, audio/video, and consumer products. Semiconductor devices are also found in military applications, aerospace, aviation, automotive, industrial controllers, and office equipment.

The semiconductor industry continues to see demands for integrated devices having lower cost and size, particularly for a monolithic microwave integrated circuit (MMIC). MMIC encompasses integrated circuits (IC) designed for operation over microwave frequencies. MMIC can be relied upon for power amplification, mixing, and high-frequency switching, among other operations. The semiconductor industry also continues to see demands for higher voltage and higher power integrated devices, including high voltage and high voltage MMIC power amplifiers, as well as radio frequency (RF) power amplifiers.

One known high voltage power amplifier uses a cascode transistor arrangement with a bias network providing an operating voltage to the transistors. When the power amplifier is non-operational, i.e., no input signal, the bias network continues to conduct current and consume power. The unnecessary power consumption of the bias network during non-operational times of the power amplifier wastes power, increases heat generation, and reduces reliability.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Figure 1A:
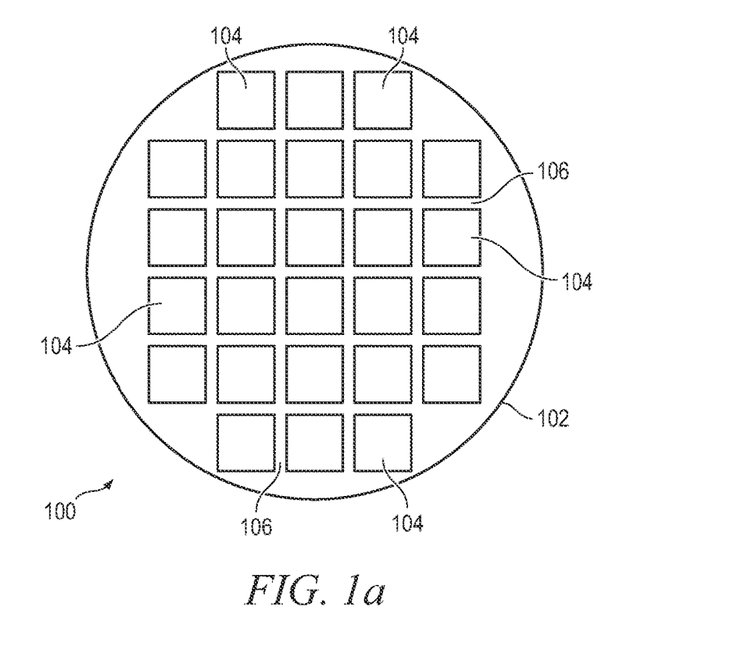
FIGS. 1a-1c illustrate a semiconductor wafer with a plurality of semiconductor die.

FIG. 1a shows semiconductor wafer or substrate 100 with a base substrate material 102, such as silicon (Si), silicon carbide (SiC), germanium, aluminum phosphide, aluminum arsenide, gallium arsenide, gallium nitride, indium phosphide, and all families of III-V and II-VI semiconductor materials for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
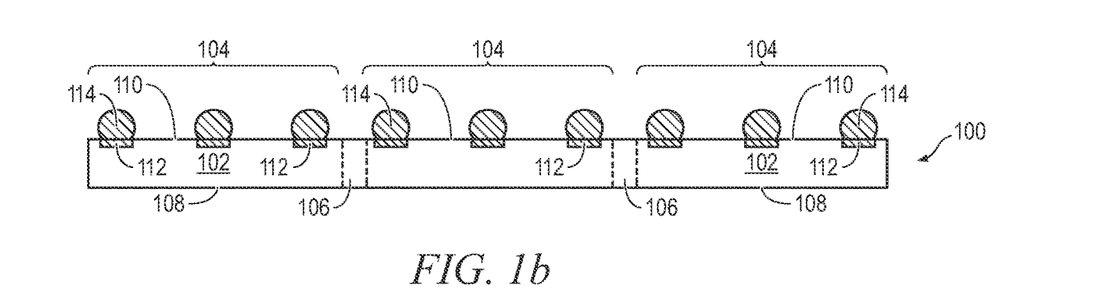

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more high voltage transistors, diodes, capacitors, and other circuit elements formed within active surface 110 to implement or be used with analog circuits or digital circuits. In the present embodiment, semiconductor die 104 contains a monolithic high voltage capacitor, in the range of 100 v to 3000 v. In another embodiment, semiconductor die 104 contains a monolithic high voltage semiconductor device, such as a diode, transistor, or other circuit or circuit element.

An electrically conductive layer 112 is formed over active surface 110 using PVD, CVD, electrolytic plating, electroless plating process, evaporation, or other suitable metal deposition process. Conductive layer 112 can be one or more layers of aluminum (Al), copper (Cu), tin (Sn), nickel (Ni), titanium (Ti), Platinum (Pt), gold (Au), silver (Ag), or other suitable electrically conductive material. Conductive layer 112 operates as contact pads electrically connected to the circuits on active surface 110.

Figure 1C:
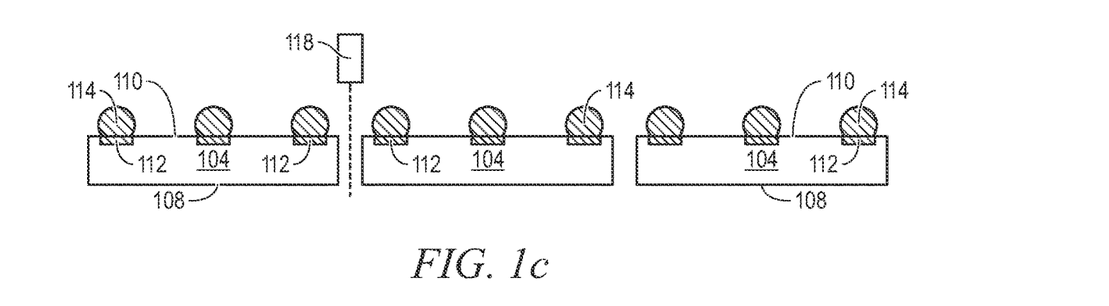

In FIG. 1c, semiconductor wafer 100 is singulated through saw street 106 using a scribe, saw blade, or laser cutting tool 118 into individual semiconductor die 104. The individual semiconductor die 104 can be inspected and electrically tested for identification of known good die or unit (KGD/KGU) post singulation.

Semiconductor die 104 may contain an RF power amplifier operating at a high voltage. The power amplifier includes multiple cells of stacked transistors biased at a high voltage, while operating similar to a common source transistor for ease of design. Each amplification cell includes transistors in a stacked (cascode) arrangement to double the operating supply voltage, without increasing the peak field strength or increasing junction temperature. The stacked transistor cells are arranged in parallel for a high-power capacity. The high supply voltage allows for higher output power, efficiency, and power gain, while operating at higher load impedances. The power amplifier exhibits lower transistor output matching losses. The amplifier cell provides reliability, performance, and no additional off-die components. The semiconductor package containing the power amplifier can have as few as three external terminals: RFIN, RFOUT, and ground. For example, semiconductor die 104 from FIG. 1c has three external terminals to accommodate RFIN, RFOUT, and ground.

Figure 2:
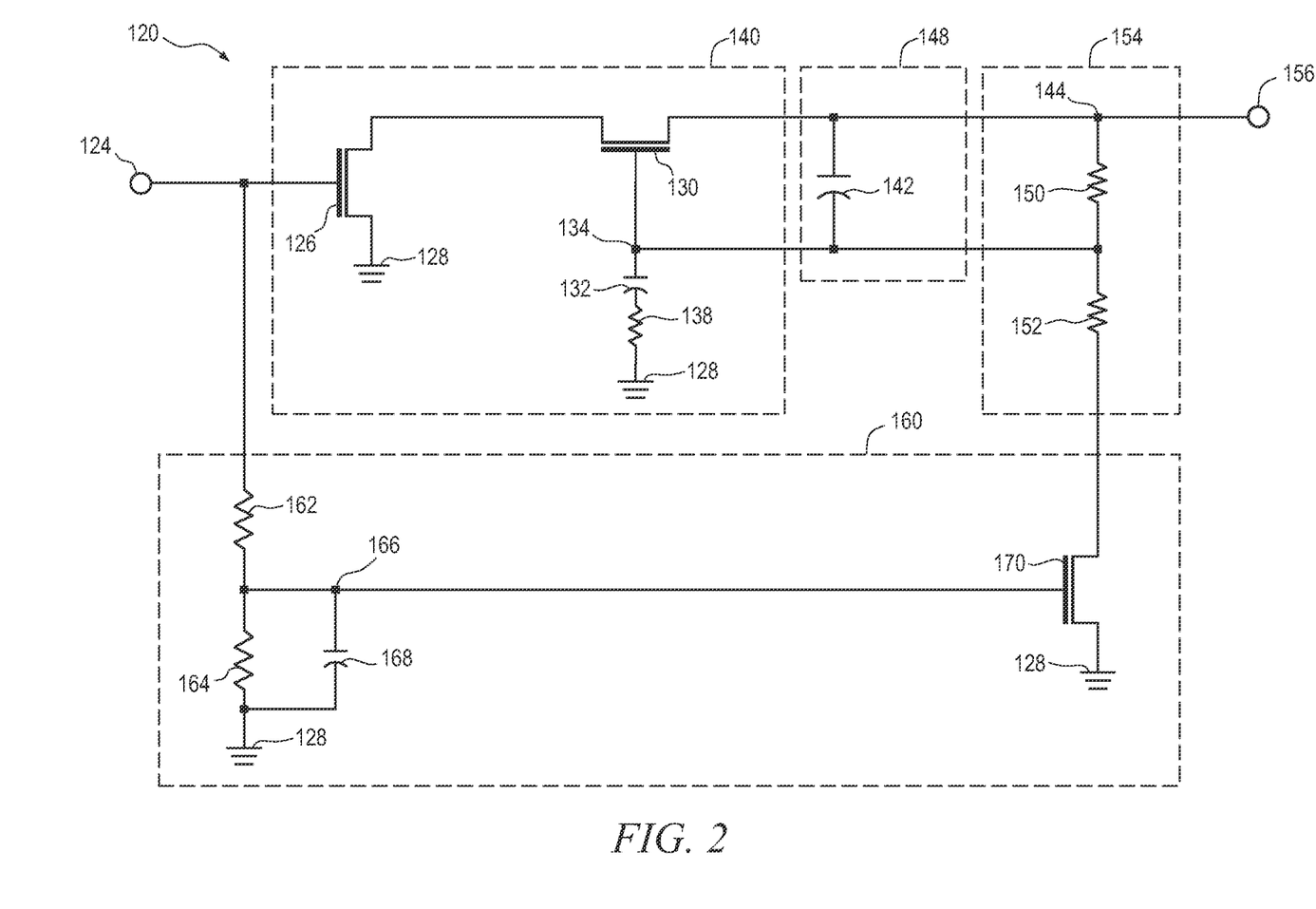
FIG. 2 illustrates a first embodiment of an amplifier cell with a shutdown circuit.

FIG. 2 illustrates amplifier cell 120 adapted for stacking transistors in a high voltage application. An RF signal is applied to terminal 124 at the gate of transistor 126. The source of transistor 126 is coupled to power supply conductor 128 operating at ground potential. The drain of transistor 126 is coupled to the source of transistor 130. The gate of transistor 130 is coupled to a first terminal of capacitor 132 at node 134. A second terminal of capacitor 132 is coupled through resistor 138 to power supply terminal 128. In one embodiment, the value of capacitor 132 is 9.75 pF and the value of resistor 138 is 0.19 ohms. Transistor 126 is a common source transistor, and transistor 130 is a common gate transistor with an RF ground. Transistors 126 and 130, capacitor 132 and resistor 138 constitute amplification stage 140 of amplifier cell 120. The drain of transistor 130 is the output of amplification stage 140. In one embodiment, the transistors described in FIGS. 2-8 can be FET transistors with field plates and connected in a cascode arrangement. Transistors 126 and 130 in amplification stage 140 can be sized to have a 36 mm channel.

Capacitor 142 is coupled between node 144 and node 134. Capacitor 142 constitutes cascode stabilizing circuit 148 of amplifier cell 120. Resistor 150 is coupled between node 144 and node 134. A first terminal of resistor 152 is coupled to node 134. In one embodiment, the value of capacitor 142 is 2.04 pF and the value of resistor 150 is 2.08 Kohms and the value of resistor 152 is 2.0 Kohms. Resistors 150 and 152 are arranged as a voltage divider and constitute bias network 154 of amplifier cell 120. Terminal 156 at node 144 is the output of amplifier cell 120.

Amplifier cell 120 is a high voltage transistor amplifier adapted for stacking and stable operation at relatively high operating voltages. Transistors 126 and 130 (as well as transistors 356, 360, and 370 in amplifier cells 350 and 430) can be formed from group III-V elemental semiconductor materials, the III-nitrides (aluminum (Al), gallium Ga), indium (In), and their alloys (AlGaIn) based nitrides), gallium Arsenide (GaAs), indium phosphide (InP), indium gallium phosphide (InGaP), aluminum gallium arsenide (AlGaAs), aluminum phosphide (AlP), aluminum arsenide (AlAs), gallium arsenide (GaAs), gallium nitride (GaN), gallium oxide (GaO), and compounds thereof. In other cases, transistors 126 and 130 (as well as transistors 356, 360, and 370) can be formed from group IV elemental semiconductor materials, silicon (Si), germanium (Ge), silicon carbide (SiC), cubic silicon carbide (3C-SiC), and compounds thereof.

An RF input signal RFIN applied to terminal 124 is amplified through amplifier cell 120 to terminal 156 as the RF output signal RFOUT. The operating supply voltage at terminal 156 in the range of 50-200V. Bias network 154 divides the operating supply voltage to node 134, approximately divide by 2. The values of resistors 150 and 152 are selected such that the voltage at the source of transistor 130 and the drain of transistor 126 is substantially equal to the voltage at node 134 or one half the operating supply voltage. Bias network 154 maintains the drain-to-source voltages of transistors 126 and 130 to within the maximum voltage ratings for those devices, even at relatively high operating supply voltages for amplifier cell 120. Capacitor 132 and resistor 138 constitute a stabilization network to maintain stable operation of amplifier cell 120. Capacitor 142 compensates for any decrease in the intrinsic drain-to-gate capacitance of transistor 130 at higher operating voltages. Amplifier cell 120 with stacked or cascode transistors, as well as the RF power amplifier containing multiple amplifier cells, uses three terminals on a semiconductor package: RFIN at terminal 124, RFOUT at terminal 156, and ground at power supply terminal 128.

When there is no RF input signal (RFIN is zero or negative), transistor 126 is non-conductive when the gate voltage of transistor 126 is less than the pinch-off voltage for the transistor. Since transistor 126 is non-conductive, transistor 130 is also non-conductive and amplifier cell 120 is not operational. Shutdown circuit 160 cuts-off current flow through resistors 150 and 152 of bias network 154 and thereby saves power when amplifier cell 120 is not operational.

Shutdown circuit 160 has an input coupled to terminal 124. Resistor 162 is coupled between terminal 124 and a first terminal of resistor 164 at node 166. Capacitor 168 is coupled between node 166 and power supply terminal 128. In one embodiment, the value of resistor 162 is 35K ohms, the value of resistor 164 is 20K ohms, and the value of capacitor 168 is 2.0 picofarads (pF). Transistor 170 has a gate coupled to node 166, a drain coupled to a second terminal of resistor 152, and a source coupled to power supply terminal 128. In one embodiment, transistor 170 in shutdown circuit 160 can be sized to have a 0.4 mm channel.

When the RF input signal is present, a small current flows through resistors 162 and 164 to establish a voltage at node 166. Resistors 162 and 164 are selected to be a large value to avoid degrading the RF input signal. Capacitor 168 is a low-pass filter for the voltage at node 166 to reduce or remove any alternating current (AC) component from terminal 124. The voltage at node 166 turns on transistor 170 and allows resistors 150 and 152 to conduct current and develop an operating voltage or bias signal at node 134. Amplifier cell 120 is operational with transistor 170 in a conductive state.

When the RF input signal is absent, i.e., below pinch-off voltage of transistor 126, no current or negative current flows in resistors 162 and 164 and zero or negative voltage is established at node 166. In a SiC technology, the pinch-off voltage may be −2.0 to −3.0 volts, transistor 170 begins to conduct with about −6.0 volts at terminal 124, and no current flows in resistors 150 and 152 of bias network 154 below −7.5 volts at terminal 124. With zero or negative voltage at node 166, transistor 170 becomes non-conductive and blocks current flow through resistors 150 and 152. Bias network 154 is non-operational with transistor 170 in a non-conductive state. In fact, voltage divider resistors 162 and 164 are selected so that transistor 170 becomes non-conductive at a lesser voltage than transistor 126, i.e., transistor 170 does not become non-conductive until after transistor 126 is non-conductive. Amplification stage 140 continues to operate in normal mode with shutdown circuit 160 enabling current flow through bias network 154 until such time as the RF input signal to amplifier cell 120 is no longer present. Shutdown circuit 160 then cuts off current flow through bias network 154 in response to a direct current (DC) component of the RF input signal. Shutdown circuit 160 prevents amplifier cell 120 from unnecessarily dissipating power in bias network 154 when the amplifier cell is non-operational. Shutdown circuit 160 saves power when amplifier cell 120 is non-operational, while having negligible influence on the amplifier cell when operational. Transistor 170 has no material impact on amplifier cell 120. Shutdown circuit 160 works for all amplifier cells described herein, without the need for any additional semiconductor package pins for bias or control of the shutdown operation.

Figure 3:
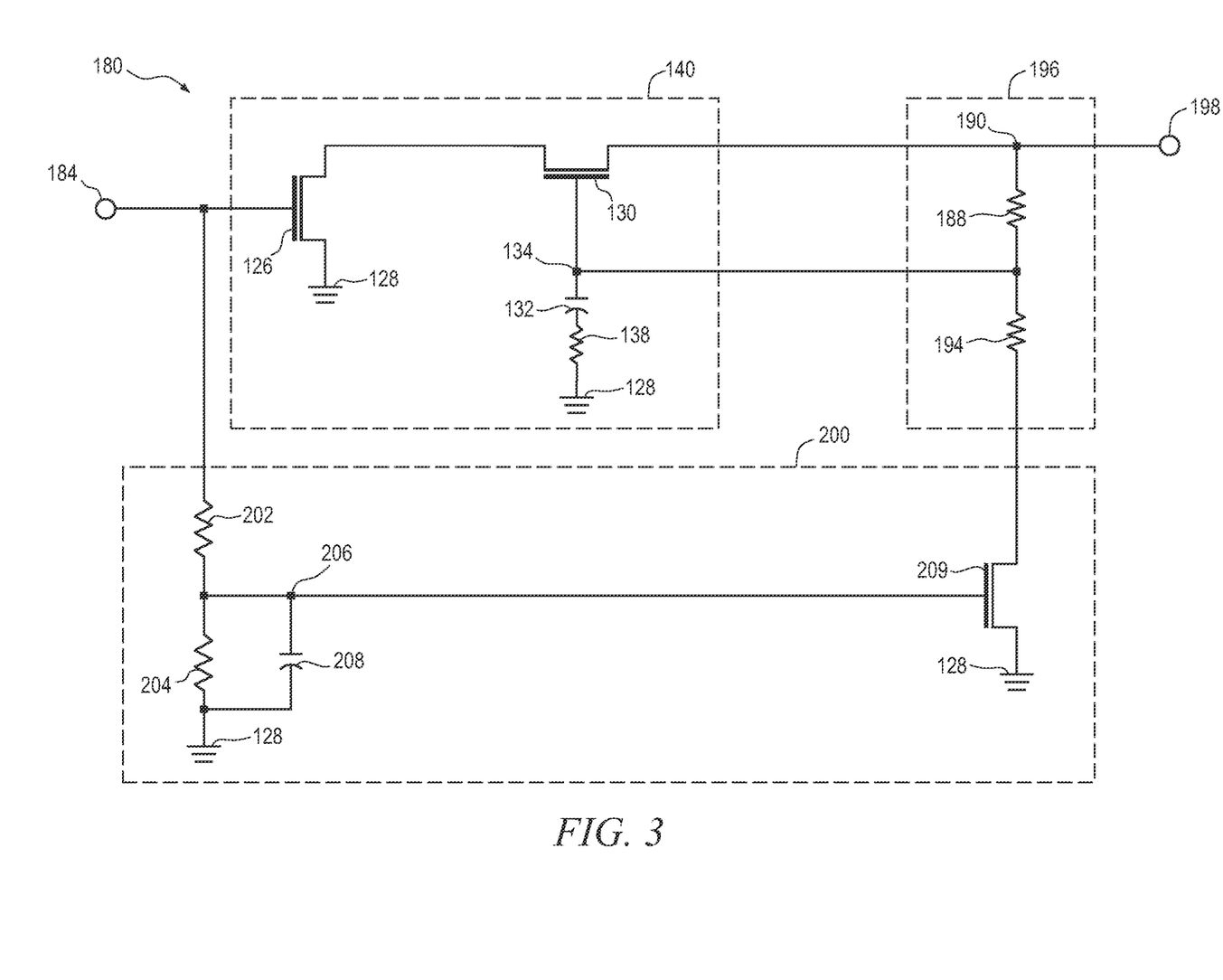
FIG. 3 illustrates a second embodiment of an amplifier cell with a shutdown circuit.

FIG. 3 illustrates another embodiment of amplifier cell 180 adapted for stacking transistors in a high voltage application. Elements having a similar function are assigned the same reference number in all figures. The structure and function of amplifier cell 180 is similar to amplifier cell 120, without stabilizing capacitor 142. An RF signal is applied to terminal 184 at the gate of transistor 126. Amplification stage 140 of amplifier cell 180 is described in FIG. 2. Resistor 188 is coupled between node 190 and node 134. A first terminal of resistor 194 is coupled to node 134. Resistors 188 and 194 constitute bias network 196 of amplifier cell 180. Terminal 198 at node 190 is the output of amplifier cell 180.

An RF input signal RFIN applied to terminal 184 is amplified through amplifier cell 180 to terminal 198 as the RF output signal RFOUT. The operating supply voltage at terminal 198 in the range of 50-200V. Bias network 196 divides the operating supply voltage to node 134, approximately divide by 2. The values of resistors 188 and 194 are selected such that the voltage at the source of transistor 130 and the drain of transistor 126 is substantially equal to the voltage at node 134 or one half the operating supply voltage. Bias network 196 maintains the drain-to-source voltages of transistors 126 and 130 to within the maximum voltage ratings for those devices, even at relatively high operating supply voltages for amplifier cell 180.

When there is no RF input signal, transistor 126 is non-conductive as the gate voltage of transistor 126 is less than the pinch-off voltage for the transistor. Since transistor 126 is non-conductive, transistor 130 is also non-conductive and amplifier cell 180 is not operational. Shutdown circuit 200 cuts-off current flow through resistors 188 and 194 of bias network 196 and thereby saves power when amplifier cell 180 is not operational.

Shutdown circuit 200 has an input coupled to terminal 184. Resistor 202 is coupled between terminal 184 and a first terminal of resistor 204 at node 206. Capacitor 208 is coupled between node 206 and power supply terminal 128. In one embodiment, the value of resistor 202 is 35K ohms, the value of resistor 204 is 20K ohms, and the value of capacitor 208 is 2.0 pF. Transistor 209 has a gate coupled to node 206, a drain coupled to a second terminal of resistor 194, and a source coupled to power supply terminal 128.

When the RF input signal is present, a small current flows through resistors 202 and 204 to establish a voltage at node 206. Resistors 202 and 204 are selected to be a large value to avoid degrading the RF input signal. Capacitor 208 is a low-pass filter for the voltage at node 206 to reduce or remove any AC component from terminal 184. The voltage at node 206 turns on transistor 209 and allows resistors 188 and 194 to conduct current and develop an operating voltage or bias signal at node 134. Amplifier cell 180 is operational with transistor 209 in a conductive state.

When the RF input signal is absent, i.e., below pinch-off voltage of transistor 126, no current or negative current flows in resistors 202 and 204 and zero or negative voltage is established at node 206. With zero or negative voltage at node 206, transistor 209 becomes non-conductive and blocks current flow through resistors 188 and 194. Bias network 196 is non-operational with transistor 209 in a non-conductive state. In fact, voltage divider resistors 202 and 204 are selected so that transistor 209 becomes non-conductive at a lesser voltage than transistor 126, i.e., transistor 209 does not become non-conductive until after transistor 126 is non-conductive. Amplification stage 140 continues to operate in normal mode with shutdown circuit 200 enabling current flow through bias network 196 until such time as the RF input signal to amplifier cell 180 is no longer present. Shutdown circuit 200 then cuts off current flow through bias network 196 in response to a DC component of the RF input signal. Shutdown circuit 200 prevents amplifier cell 180 from unnecessarily dissipating power in bias network 196 when the amplifier cell is non-operational. Shutdown circuit 200 saves power when amplifier cell 180 is non-operational, while having negligible influence on the amplifier cell when operational. Transistor 209 has no material impact on amplifier cell 180. Shutdown circuit 200 works for all amplifier cells described herein, without the need for any additional semiconductor package pins for bias or control of the shutdown operation.

Figure 4:
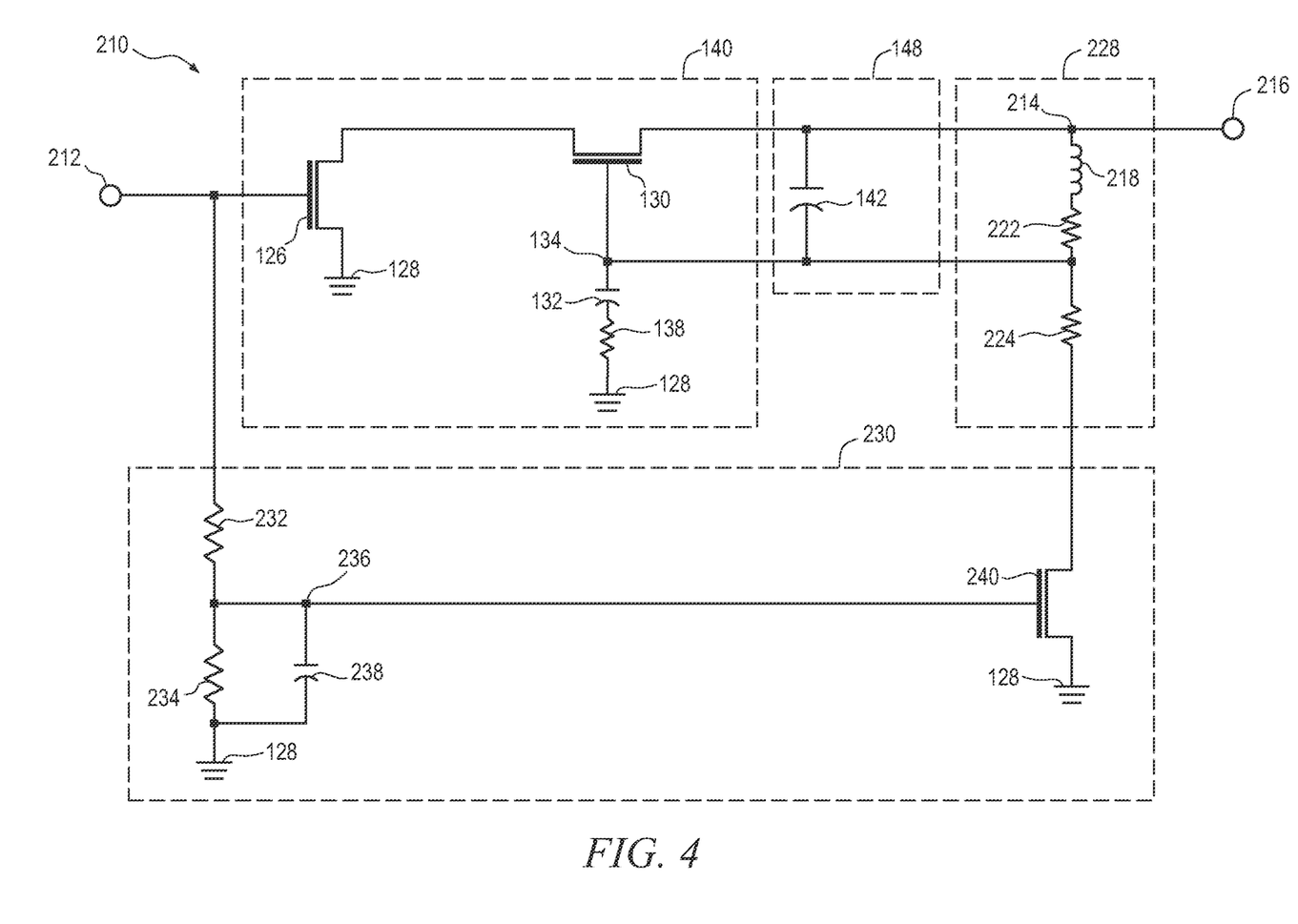
FIG. 4 illustrates a third embodiment of an amplifier cell with a shutdown circuit.

FIG. 4 illustrates another embodiment of amplifier cell 210 adapted for stacking transistors in a high voltage application. An RF signal is applied to terminal 212 at the gate of transistor 126. Amplification stage 140 and cascode stabilizing circuit 148 of amplifier cell 210 are described in FIG. 2. The output of amplification stage 140 is node 214 and terminal 216. Choke coil or inductor 218 is coupled between node 214 and a first terminal of resistor 222. Resistor 222 is coupled between inductor 218 and node 134. A first terminal of resistor 224 is coupled to node 134. Inductor 218 and resistors 222 and 224 constitute bias network 228 of amplifier cell 210. Terminal 216 is the output of amplifier cell 210.

An RF input signal RFIN applied to terminal 212 is amplified through amplifier cell 210 to terminal 216 as the RF output signal RFOUT. The operating supply voltage at terminal 216 in the range of 50-200V. Bias network 228 divides the operating supply voltage to node 134, approximately divide by 2. Inductor 218 provides bias network 228 a larger RF impedance, as compared to bias network 154, 196. The values of resistor 222 and 224 can be increased to give bias network 228 a larger DC impedance. The performance of amplifier cell 210 is suitable for amplification of a wide range of input frequencies and over a wide range of operating supply voltages, particularly at higher operating supply voltages, with relatively higher efficiency. Bias network 228 maintains the drain-to-source voltages of transistors 126 and 130 to within the maximum voltage ratings for those devices, even at relatively high operating supply voltages for amplifier cell 210. Inductor 218 may be located off-die.

When there is no RF input signal, transistor 126 is non-conductive as the gate voltage of transistor 126 is less than the pinch-off voltage for the transistor. Since transistor 126 is non-conductive, transistor 130 is also non-conductive and amplifier cell 210 is not operational. Shutdown circuit 230 cuts-off current flow through inductor 218 and resistors 222 and 224 of bias network 228 and thereby saves power when amplifier cell 210 is not operational.

Shutdown circuit 230 has an input coupled to terminal 212. Resistor 232 is coupled between terminal 212 and a first terminal of resistor 234 at node 236. Capacitor 238 is coupled between node 236 and power supply terminal 128. Transistor 240 has a gate coupled to node 236, a drain coupled to a second terminal of resistor 224, and a source coupled to power supply terminal 128.

When the RF input signal is present, a small current flows through resistors 232 and 234 to establish a voltage at node 236. Resistors 232 and 234 are selected to be a large value to avoid degrading the RF input signal. Capacitor 228 is a low-pass filter for the voltage at node 236 to reduce or remove any AC component from terminal 212. The voltage at node 236 turns on transistor 240 and allows inductor 218 and resistors 222 and 224 to conduct current and develop an operating voltage or bias signal at node 134. Amplifier cell 210 is operational with transistor 240 in a conductive state.

When the RF input signal is absent, i.e., below pinch-off voltage of transistor 126, no current or negative current flows in resistors 232 and 234 and zero or negative voltage is established at node 236. With zero or negative voltage at node 236, transistor 240 becomes non-conductive and blocks current flow through inductor 218 and resistors 222 and 224. Bias network 228 is non-operational with transistor 240 in a non-conductive state. In fact, voltage divider resistors 232 and 234 are selected so that transistor 240 becomes non-conductive at a lesser voltage than transistor 126, i.e., transistor 240 does not become non-conductive until after transistor 126 is non-conductive. Amplification stage 140 continues to operate in normal mode with shutdown circuit 230 enabling current flow through bias network 228 until such time as the RF input signal to amplifier cell 210 is no longer present. Shutdown circuit 230 then cuts off current flow through bias network 228 in response to a DC component of the RF input signal. Shutdown circuit 230 prevents amplifier cell 210 from unnecessarily dissipating power in bias network 228 when the amplifier cell is non-operational. Shutdown circuit 230 saves power when amplifier cell 210 is non-operational, while having negligible influence on the amplifier cell when operational. Transistor 240 has no material impact on amplifier cell 210. Shutdown circuit 230 works for all amplifier cells described herein, without the need for any additional semiconductor package pins for bias or control of the shutdown operation.

Figure 5:
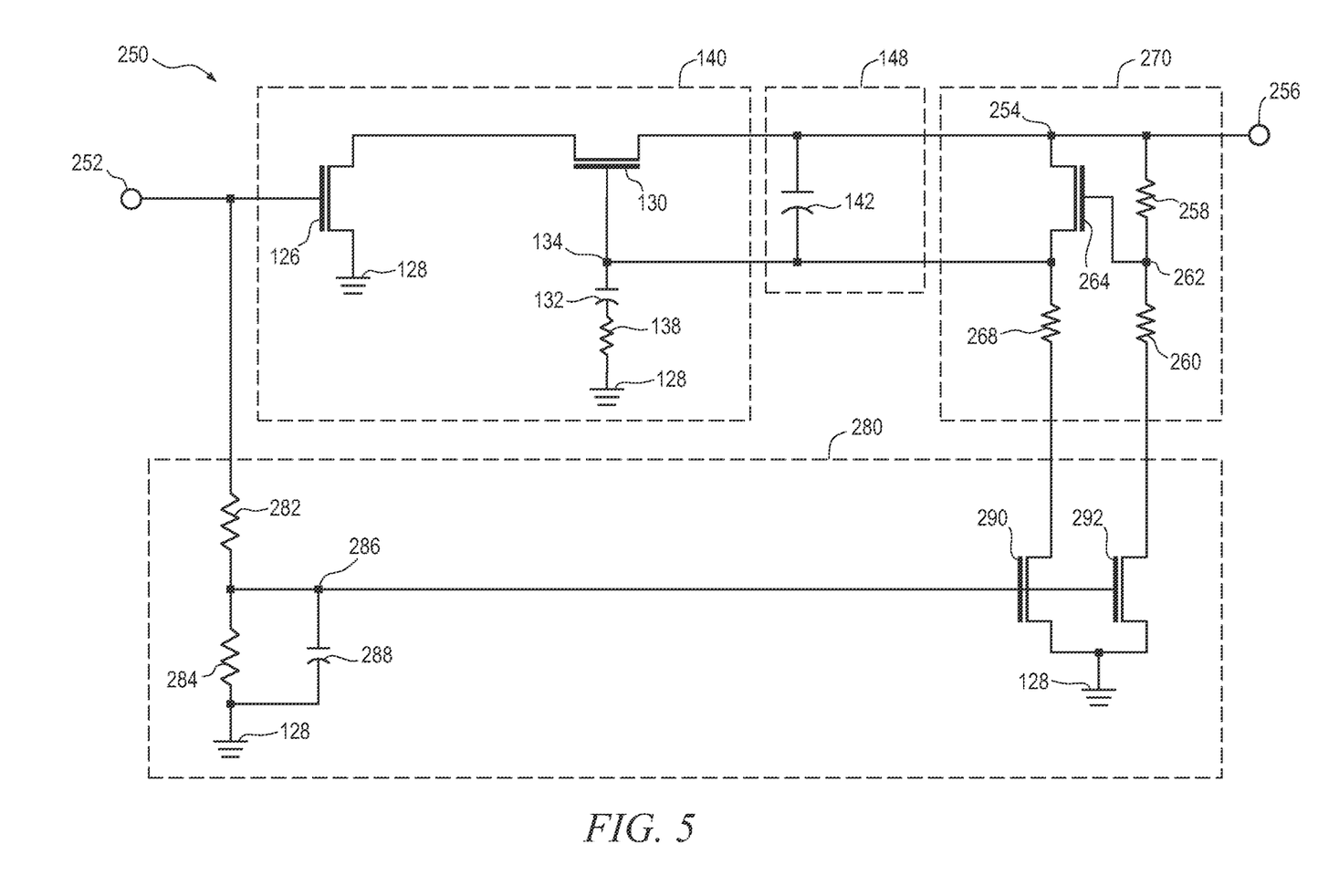
FIG. 5 illustrates a fourth embodiment of an amplifier cell with a shutdown circuit.

FIG. 5 illustrates another embodiment of amplifier cell 250 adapted for stacking transistors in a high voltage application. An RF signal is applied to terminal 252 at the gate of transistor 126. Amplification stage 140 and cascode stabilizing circuit 148 of amplifier cell 250 are described in FIG. 2. The output of amplification stage 140 is node 254 and terminal 256. Resistor 258 is coupled between node 254 and a first terminal of resistor 260 at node 262. Transistor 264 has a gate coupled to node 262, a drain coupled to node 254, and a source coupled to node 134 and to a first terminal of resistor 268. Transistor 264 and resistors 258, 260, and 268 constitute bias network 270 of amplifier cell 250. Terminal 256 is the output of amplifier cell 250.

An RF input signal RFIN applied to terminal 252 is amplified through amplifier cell 250 to terminal 256 as the RF output signal RFOUT. The operating supply voltage at terminal 256 in the range of 50-200V. Bias network 270 maintains the drain-to-source voltages of transistors 126 and 130 to within the maximum voltage ratings for those devices, even at relatively high operating supply voltages for amplifier cell 250. The source follower configuration of transistor 264 supplies additional current to the gate of transistor 130 to support large RFIN signals. Resistor 268 operates as a current source.

When there is no RF input signal, transistor 126 is non-conductive as the gate voltage of transistor 126 is less than the pinch-off voltage for the transistor. Since transistor 126 is non-conductive, transistor 130 is also non-conductive and amplifier cell 250 is not operational. Shutdown circuit 280 cuts-off current flow through resistors 258, 260, and 268 of bias network 270 and thereby saves power when amplifier cell 250 is not operational.

Shutdown circuit 280 has an input coupled to terminal 252. Resistor 282 is coupled between terminal 252 and a first terminal of resistor 284 at node 286. Capacitor 288 is coupled between node 286 and power supply terminal 128. Transistor 290 has a gate coupled to node 286, a drain coupled to a second terminal of resistor 268, and a source coupled to power supply terminal 128. Transistor 292 has a gate coupled to node 286, a drain coupled to a second terminal of resistor 260, and a source coupled to power supply terminal 128.

When the RF input signal is present, a small current flows through resistors 282 and 284 to establish a voltage at node 286. Resistors 282 and 284 are selected to be a large value to avoid degrading the RF input signal. Capacitor 288 is a low-pass filter for the voltage at node 286 to reduce or remove any AC component from terminal 252. The voltage at node 286 turns on transistor 290 and allows resistor 268 to conduct current. The voltage at node 286 also turns on transistor 292 and allows resistors 258 and 260 to conduct current and turn on transistor 264 to develop an operating voltage or bias signal at node 134. Amplifier cell 250 is operational with transistors 290 and 292 in a conductive state.

When the RF input signal is absent, i.e., below pinch-off voltage of transistor 126, no current or negative current flows in resistors 282 and 284 and zero or negative voltage is established at node 286. With zero or negative voltage at node 286, transistors 290 and 292 become non-conductive and block current flow through resistors 258, 260, and 268. Bias network 270 is non-operational with transistors 290 and 292 in a non-conductive state. In fact, voltage divider resistors 282 and 284 are selected so that transistors 290 and 292 become non-conductive at a lesser voltage than transistor 126, i.e., transistors 290 and 292 do not become non-conductive until after transistor 126 is non-conductive. Amplification stage 140 continues to operate in normal mode with shutdown circuit 280 enabling current flow through bias network 270 until such time as the RF input signal to amplifier cell 250 is no longer present. Shutdown circuit 280 then cuts off current flow through bias network 270 in response to a DC component of the RF input signal. Shutdown circuit 280 prevents amplifier cell 250 from unnecessarily dissipating power in bias network 270 when the amplifier cell is non-operational. Shutdown circuit 280 saves power when amplifier cell 250 is non-operational, while having negligible influence on the amplifier cell when operational. Transistors 290 and 292 have no material impact on amplifier cell 250. Shutdown circuit 280 works for all amplifier cells described herein, without the need for any additional semiconductor package pins for bias or control of the shutdown operation.

Figure 6:
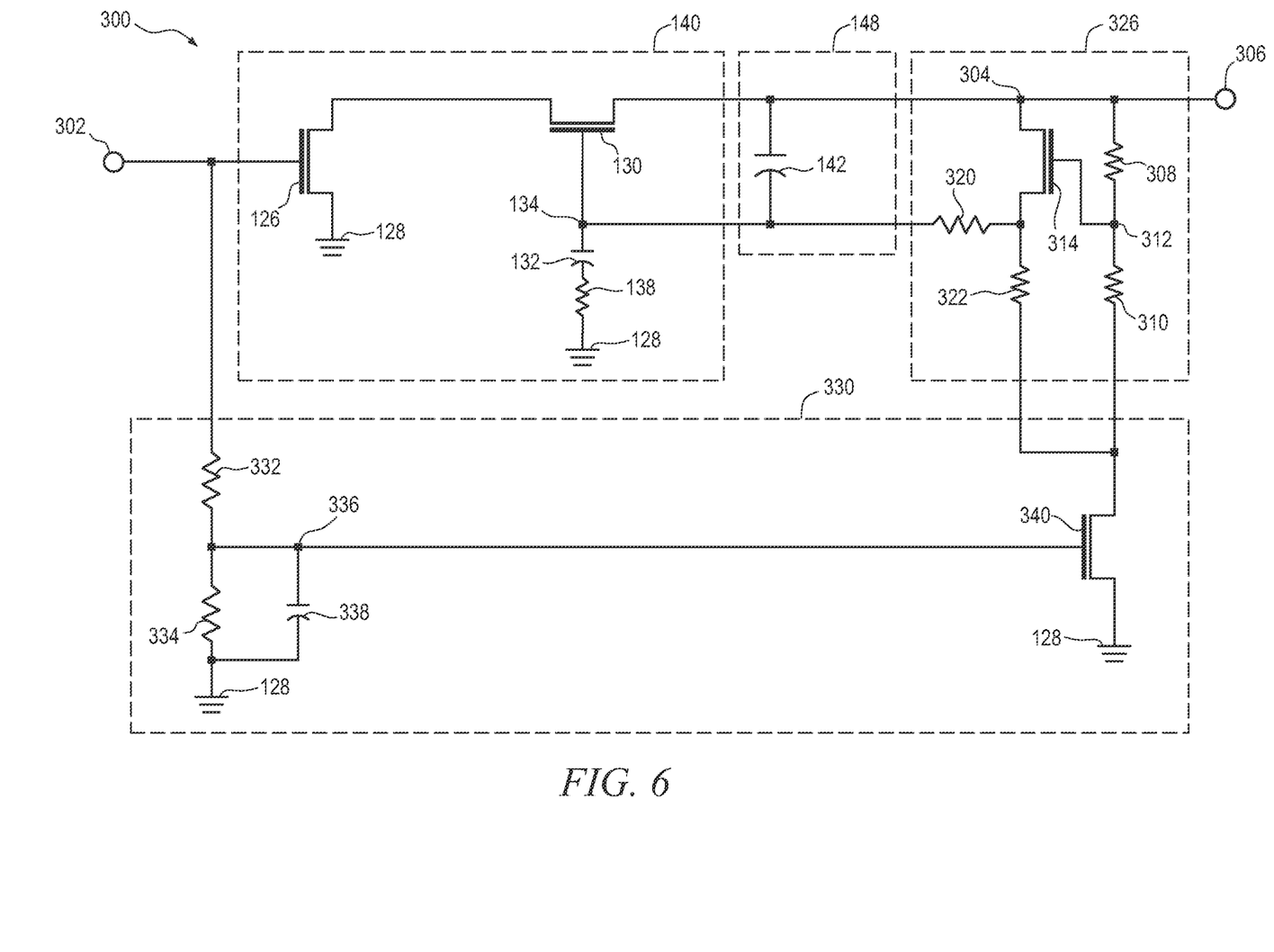
FIG. 6 illustrates a fifth embodiment of an amplifier cell with a shutdown circuit.

FIG. 6 illustrates another embodiment of amplifier cell 300 adapted for stacking transistors in a high voltage application. An RF signal is applied to terminal 302 at the gate of transistor 126. Amplification stage 140 and cascode stabilizing circuit 148 of amplifier cell 300 are described in FIG. 2. The output of amplification stage 140 is node 304 and terminal 306. Resistor 308 is coupled between node 304 and a first terminal of resistor 310 at node 312. Transistor 314 has a gate coupled to node 312, a drain coupled to node 304, and a source coupled to a first terminal of resistor 320 and to a first terminal of resistor 322. A second terminal of resistor 320 is coupled to node 134. Transistor 314 and resistors 308, 310, 320, and 322 constitute bias network 326 of amplifier cell 300. Terminal 306 is the output of amplifier cell 300.

An RF input signal RFIN applied to terminal 302 is amplified through amplifier cell 300 to terminal 306 as the RF output signal RFOUT. The operating supply voltage at terminal 306 in the range of 50-200V. Bias network 326 maintains the drain-to-source voltages of transistors 126 and 130 to within the maximum voltage ratings for those devices, even at relatively high operating supply voltages for amplifier cell 300. The source follower configuration of transistor 314 supplies additional current to the gate of transistor 130 to support large RFIN signals. Resistor 320 provides bias stabilization. Resistor 322 operates as a current source.

When there is no RF input signal, transistor 126 is non-conductive as the gate voltage of transistor 126 is less than the pinch-off voltage for the transistor. Since transistor 126 is non-conductive, transistor 130 is also non-conductive and amplifier cell 300 is not operational. Shutdown circuit 330 cuts-off current flow through resistors 308, 310, and 322 of bias network 326 and thereby saves power when amplifier cell 300 is not operational.

Shutdown circuit 330 has an input coupled to terminal 302. Resistor 332 is coupled between terminal 302 and a first terminal of resistor 334 at node 336. Capacitor 338 is coupled between node 336 and power supply terminal 128. Transistor 340 has a gate coupled to node 336, a drain coupled to a second terminal of resistor 310 and to a second terminal of resistor 322, and a source coupled to power supply terminal 128. Transistor 340 illustrates how the shutdown circuit can use one or two or more transistors, as with transistors 290 and 292 in FIG. 5, to disable the bias network.

When the RF input signal is present, a small current flows through resistors 332 and 334 to establish a voltage at node 336. Resistors 332 and 334 are selected to be a large value to avoid degrading the RF input signal. Capacitor 338 is a low-pass filter for the voltage at node 336 to reduce or remove any AC component from terminal 302. The voltage at node 336 turns on transistor 340 and allows resistors 308, 310, and 322 to conduct current and turn on transistor 314 to develop an operating voltage or bias signal at node 134. Amplifier cell 300 is operational with transistor 340 in a conductive state.

When the RF input signal is absent, i.e., below pinch-off voltage of transistor 126, no current or negative current flows in resistors 332 and 334 and zero or negative voltage is established at node 336. With zero or negative voltage at node 336, transistor 340 becomes non-conductive and blocks current flow through resistors 308, 310, and 322. Bias network 326 is non-operational with transistor 340 in a non-conductive state. In fact, voltage divider resistors 332 and 334 are selected so that transistor 340 becomes non-conductive at a lesser voltage than transistor 126, i.e., transistor 340 does not become non-conductive until after transistor 126 is non-conductive. Amplification stage 140 continues to operate in normal mode with shutdown circuit 330 enabling current flow through bias network 326 until such time as the RF input signal to amplifier cell 300 is no longer present. Shutdown circuit 330 then cuts off current flow through bias network 326 in response to a DC component of the RF input signal. Shutdown circuit 330 prevents amplifier cell 300 from unnecessarily dissipating power in bias network 326 when the amplifier cell is non-operational. Shutdown circuit 330 saves power when amplifier cell 300 is non-operational, while having negligible influence on the amplifier cell when operational. Transistors 332 and 334 have no material impact on amplifier cell 300. Shutdown circuit 330 works for all amplifier cells described herein, without the need for any additional semiconductor package pins for bias or control of the shutdown operation.

Figure 7:
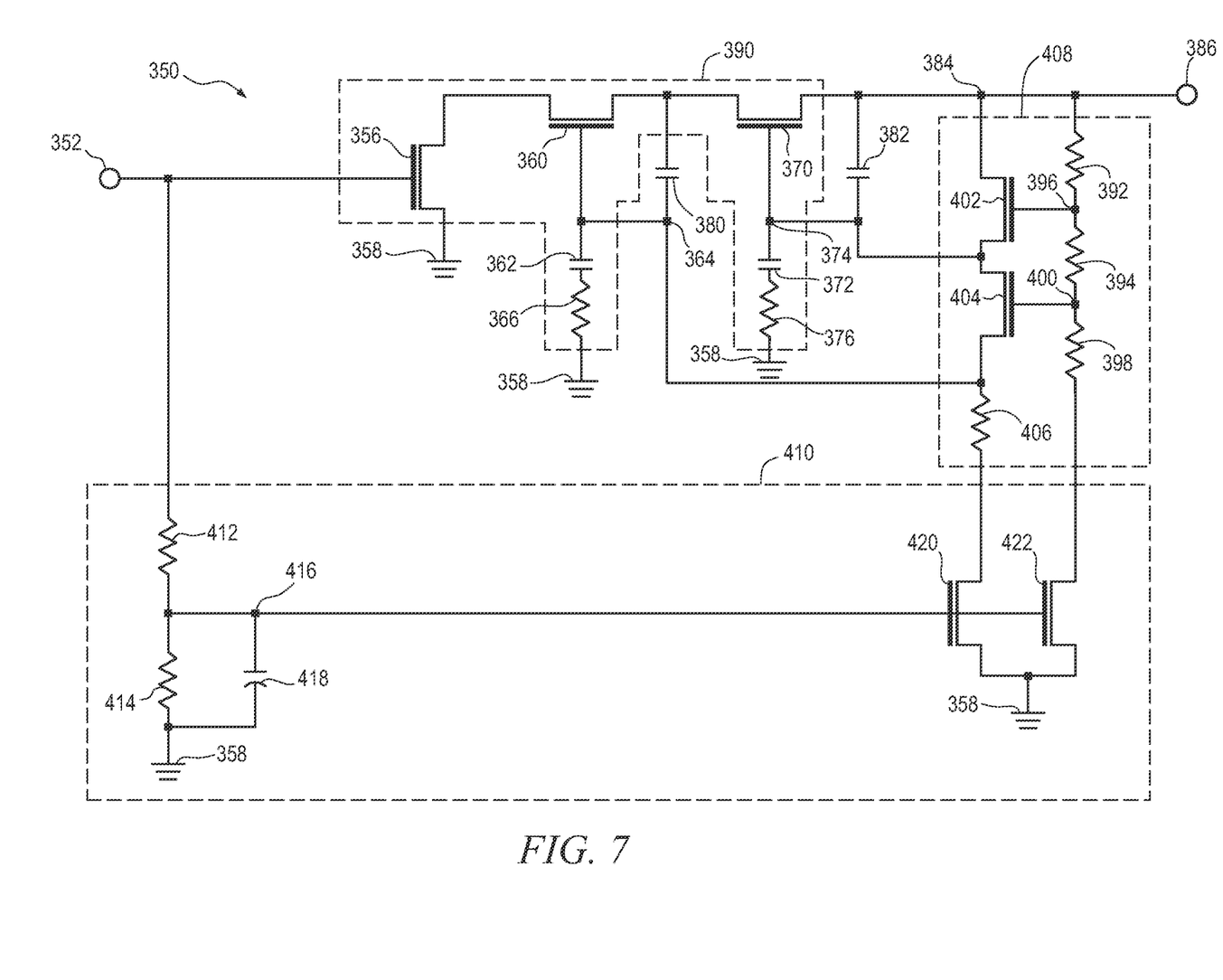
FIG. 7 illustrates a sixth embodiment of an amplifier cell with a shutdown circuit.

FIG. 7 illustrates another embodiment of amplifier cell 350 adapted for stacking transistors in a high voltage application. An RF signal is applied to terminal 352 at the gate of transistor 356. The source of transistor 356 is coupled to power supply conductor 358 operating at ground potential. The drain of transistor 356 is coupled to the source of transistor 360. The gate of transistor 360 is coupled to a first terminal of capacitor 362 at node 364. A second terminal of capacitor 362 is coupled through resistor 366 to power supply terminal 358. The drain of transistor 360 is coupled to the source of transistor 370. The gate of transistor 370 is coupled to a first terminal of capacitor 372 at node 374. Transistor 356 is a common source transistor, and transistors 360 and 370 are common gate transistors. A second terminal of capacitor 372 is coupled through resistor 376 to power supply terminal 358. Transistors 356, 360, and 370, capacitors 362 and 372, and resistors 366 and 376 constitute amplification stage 390 of amplifier cell 350. The drain of transistor 370 is the output of amplification stage 390. In one embodiment, the transistors described in FIGS. 2-8 can be FET transistors with field plates and connected in a cascode arrangement. Transistors 356, 360, and 370 in amplification stage 390 can be sized to have a 36 mm channel.

Capacitor 380 is coupled between node 364 and the common source-drain of transistors 360 and 370. Capacitor 382 is coupled between node 374 and node 384 at terminal 386. Resistor 392 is coupled between node 384 and node 396. A first terminal of resistor 394 is coupled to node 396. A second terminal of resistor 394 is coupled to a first terminal of resistor 398 at node 400. Transistor 402 has a gate coupled to node 396, a drain coupled to node 384, and a source coupled to node 374. Transistor 404 has a gate coupled to node 400, a drain coupled to node 374, and a source coupled to a first terminal of resistor 406 at node 364. Transistors 402 and 404 and resistors 392, 394, 398, and 406 constitute bias network 408 of amplifier cell 350. Terminal 386 is the output of amplifier cell 350.

An RF input signal RFIN applied to terminal 352 is amplified through amplifier cell 350 to terminal 386 as the RF output signal RFOUT. The operating supply voltage at terminal 386 in the range of 50-200V. Bias network 408 maintains the drain-to-source voltages of transistors 356, 360, and 370 to within the maximum voltage ratings for those devices, even at relatively high operating supply voltages for amplifier cell 350. The source follower configuration of transistors 402 and 404 supplies additional current to the gates of transistors 360 and 370 to support large RFIN signals. Resistor 406 operates as a current source.

When there is no RF input signal, transistor 356 is non-conductive as the gate voltage of transistor 356 is less than the pinch-off voltage for the transistor. Since transistor 356 is non-conductive, transistors 360 and 370 are also non-conductive and amplifier cell 350 is not operational. Shutdown circuit 410 cuts-off current flow through resistors 392, 394, 398, and 406 of bias network 408 and thereby saves power when amplifier cell 350 is not operational.

Shutdown circuit 410 has an input coupled to terminal 352. Resistor 412 is coupled between terminal 352 and a first terminal of resistor 414 at node 416. Capacitor 418 is coupled between node 416 and power supply terminal 358. Transistor 420 has a gate coupled to node 416, a drain coupled to a second terminal of resistor 406, and a source coupled to power supply terminal 358. Transistor 422 has a gate coupled to node 416, a drain coupled to a second terminal of resistor 398, and a source coupled to power supply terminal 358.

When the RF input signal is present, a small current flows through resistors 412 and 414 to establish a voltage at node 416. Resistors 412 and 414 are selected to be a large value to avoid degrading the RF input signal. Capacitor 418 is a low-pass filter for the voltage at node 416 to reduce or remove any AC component from terminal 352. The voltage at node 416 turns on transistor 420 and allows resistor 406 to conduct current. The voltage at node 416 also turns on transistor 422 and allows resistors 392, 394, and 398 to conduct current and turn on transistors 402 and 404 to develop an operating voltage or bias signal at node 364 and 374. Amplifier cell 350 is operational with transistors 420 and 422 in a conductive state.

When the RF input signal is absent, i.e., below pinch-off voltage of transistor 356, no current or negative current flows in resistors 412 and 414 and zero or negative voltage is established at node 416. With zero or negative voltage at node 416, transistors 420 and 422 become non-conductive and block current flow through resistors 392, 394, 398, and 406. Bias network 408 is non-operational with transistors 420 and 422 in a non-conductive state. In fact, voltage divider resistors 412 and 414 are selected so that transistors 420 and 422 become non-conductive at a lesser voltage than transistor 356, i.e., transistors 420 and 422 do not become non-conductive until after transistor 356 is non-conductive. Amplification stage 390 continues to operate in normal mode with shutdown circuit 410 enabling current flow through bias network 408 until such time as the RF input signal to amplifier cell 350 is no longer present. Shutdown circuit 410 then cuts off current flow through bias network 408 in response to a DC component of the RF input signal. Shutdown circuit 410 prevents amplifier cell 350 from unnecessarily dissipating power in bias network 408 when the amplifier cell is non-operational. Shutdown circuit 410 saves power when amplifier cell 350 is non-operational, while having negligible influence on the amplifier cell when operational. Transistors 412 and 414 have no material impact on amplifier cell 350. Shutdown circuit 410 works for all amplifier cells described herein, without the need for any additional semiconductor package pins for bias or control of the shutdown operation.

Figure 8:
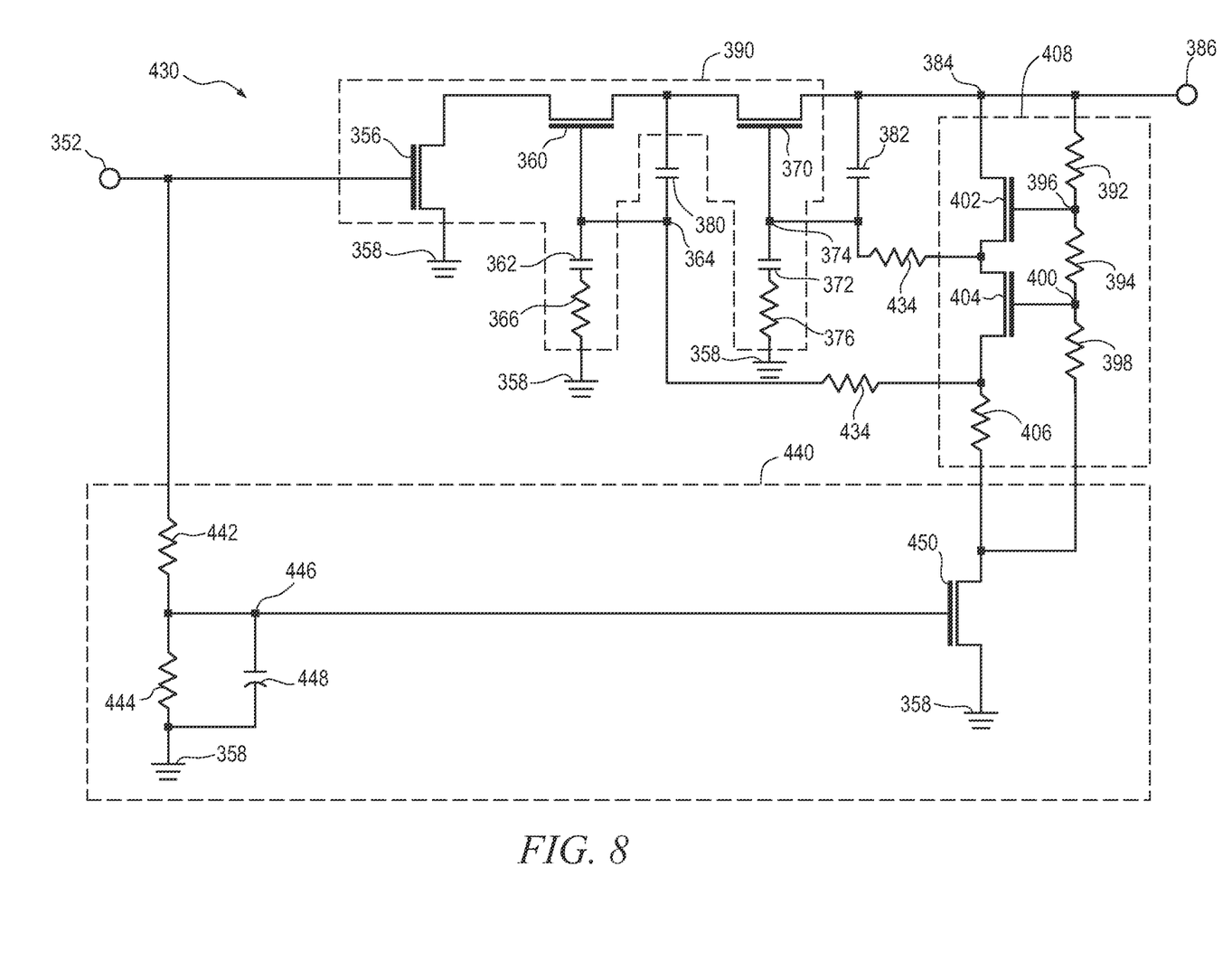
FIG. 8 illustrates a seventh embodiment of an amplifier cell with a shutdown circuit.

FIG. 8 illustrates another embodiment of amplifier cell 430 adapted for stacking transistors in a high voltage application. Amplifier cell 430 follows a similar structure and operation as amplifier cell 350 in FIG. 7 with the addition of resistor 432 coupled between the source of transistor 404 and node 364, and further resistor 434 coupled between the source of transistor 402 and node 374. Resistor 432 and 434 are stabilizing resistors for nodes 364 and 374.

Shutdown circuit 440 has an input coupled to terminal 352. Resistor 442 is coupled between terminal 352 and a first terminal of resistor 444 at node 446. Capacitor 448 is coupled between node 446 and power supply terminal 358. Transistor 450 has a gate coupled to node 446, a drain coupled to a second terminal of resistor 406 and to a second terminal of resistor 398, and a source coupled to power supply terminal 358. Transistor 450 illustrates how the shutdown circuit can use one or two or more transistors, as with transistors 420 and 422 in FIG. 7, to disable the bias network.

When the RF input signal is present, a small current flows through resistors 442 and 444 to establish a voltage at node 446. Resistors 442 and 444 are selected to be a large value to avoid degrading the RF input signal. Capacitor 448 is a low-pass filter for the voltage at node 446 to reduce or remove any AC component from terminal 352. The voltage at node 446 turns on transistor 450 and allows resistors 392, 394, 398, and 406 to conduct current and turn on transistors 402 and 404 to develop an operating voltage or bias signal at nodes 364 and 374. Amplifier cell 430 is operational with transistor 450 in a conductive state.

When the RF input signal is absent, i.e., below pinch-off voltage of transistor 356, no current or negative current flows in resistors 442 and 444 and zero or negative voltage is established at node 446. With zero or negative voltage at node 446, transistor 450 becomes non-conductive and blocks current flow through resistors 392, 394, 398, and 406. Bias network 408 is non-operational with transistor 450 in a non-conductive state. In fact, voltage divider resistors 442 and 444 are selected so that transistor 450 become non-conductive at a lesser voltage than transistor 356, i.e., transistor 450 does not become non-conductive until after transistor 356 is non-conductive. Amplification stage 390 continues to operate in normal mode with shutdown circuit 440 enabling current flow through bias network 408 until such time as the RF input signal to amplifier cell 430 is no longer present. Shutdown circuit 440 then cuts off current flow through bias network 408 in response to a DC component of the RF input signal. Shutdown circuit 440 prevents amplifier cell 430 from unnecessarily dissipating power in bias network 408 when the amplifier cell is non-operational. Shutdown circuit 440 saves power when amplifier cell 430 is non-operational, while having negligible influence on the amplifier cell when operational. Transistors 442 and 444 have no material impact on amplifier cell 430. Shutdown circuit 430 works for all amplifier cells described herein, without the need for any additional semiconductor package pins for bias or control of the shutdown operation.

FIGS. 2-8 illustrate a variety of amplifier cells 120, 180, 210, 250, 300, 350, and 430, each with a similar shutdown circuit. Shutdown circuits 160, 200, 230, 280, 330, 410, and 440 are substantially the same configuration, each designed to disable the bias network when the amplifier cell is non-operational. The shutdown circuit disables the bias network by blocking current flow through the bias network. Each amplifier cell uses three terminals on a semiconductor package: RFIN, RFOUT, and ground terminal. The shutdown circuit does not require an external package terminal.

Figure 9:
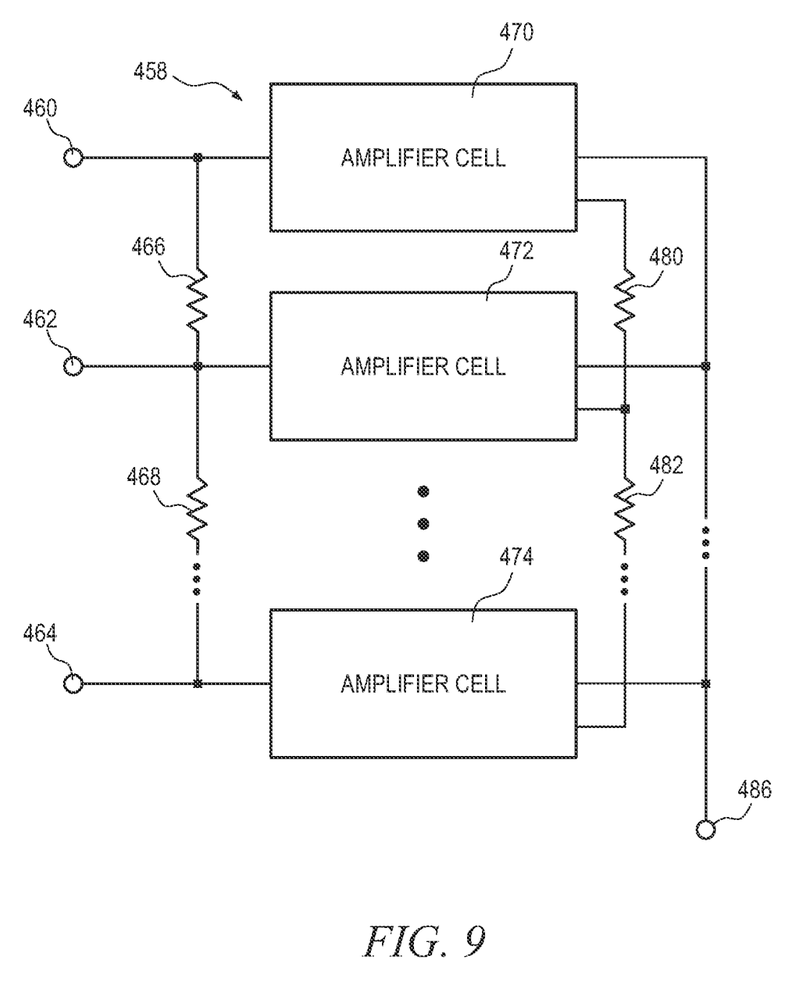
FIG. 9 illustrates a high voltage power amplifier containing multiple amplifier cells.

FIG. 9 illustrates combining multiple amplifier cells in parallel to further increase high voltage operation of RF power amplifier 458. An RF input signal is applied to individual terminals 460, 462, and 464 associated with each amplifier cell. Resistors 466 and 468 are coupled between terminals 460-464 to isolate the terminals. Amplifier cell 470 contains one of amplifier cells 120, 180, 210, 250, 300, 350, and 430. Amplifier cell 472 contains one of amplifier cells 120, 180, 210, 250, 300, 350, and 430. Amplifier cell 474 contains one of amplifier cells 120, 180, 210, 250, 300, 350, and 430. RF power amplifier 458 can have any number of amplifier cells connected in parallel. The output terminal of each amplifier cell is connected to terminal 486 as the output of RF power amplifier 458. Resistors 480 and 482 are connected to an internal node within the amplifier cells, e.g., corresponding to node 134 in FIG. 2, to provide isolation between the amplifier cells. With multiple amplifier cells, RF power amplifier 458 can deliver 800 or more watts to terminal 486 under load.

Figure 10:
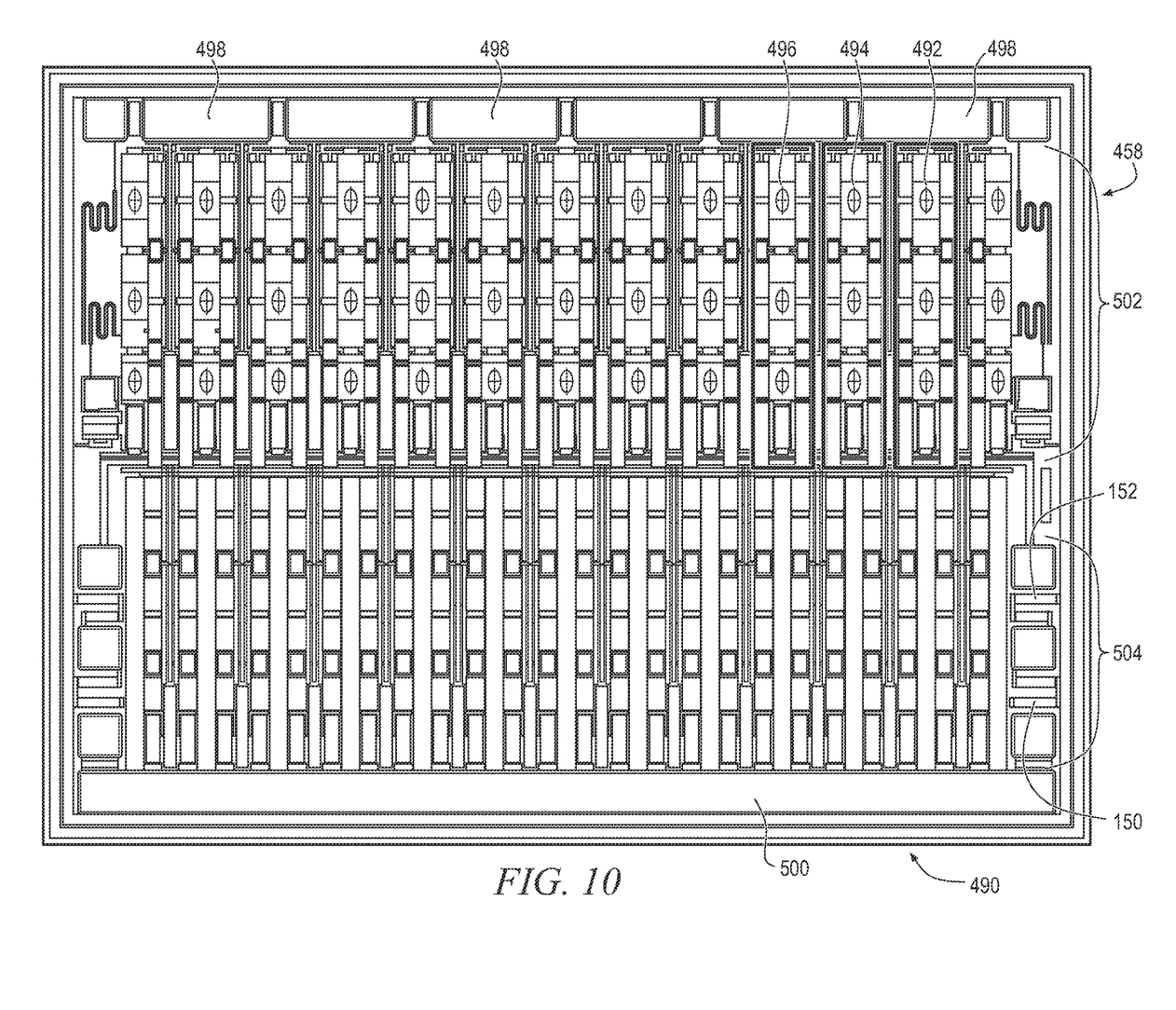
FIG. 10 illustrates a layout of the high voltage power amplifier containing multiple amplifier cells.

FIG. 10 represents layout 490 of RF power amplifier 458. Amplifier cell 470 is located in area 492, amplifier cell 472 is located in area 494, and amplifier cell 474 is located in area 496. Additional amplifier cells would be located in similar areas. Terminals 460-464 are located on individual pads 498. Terminal 486 is located on pad 500.

Figure 11:
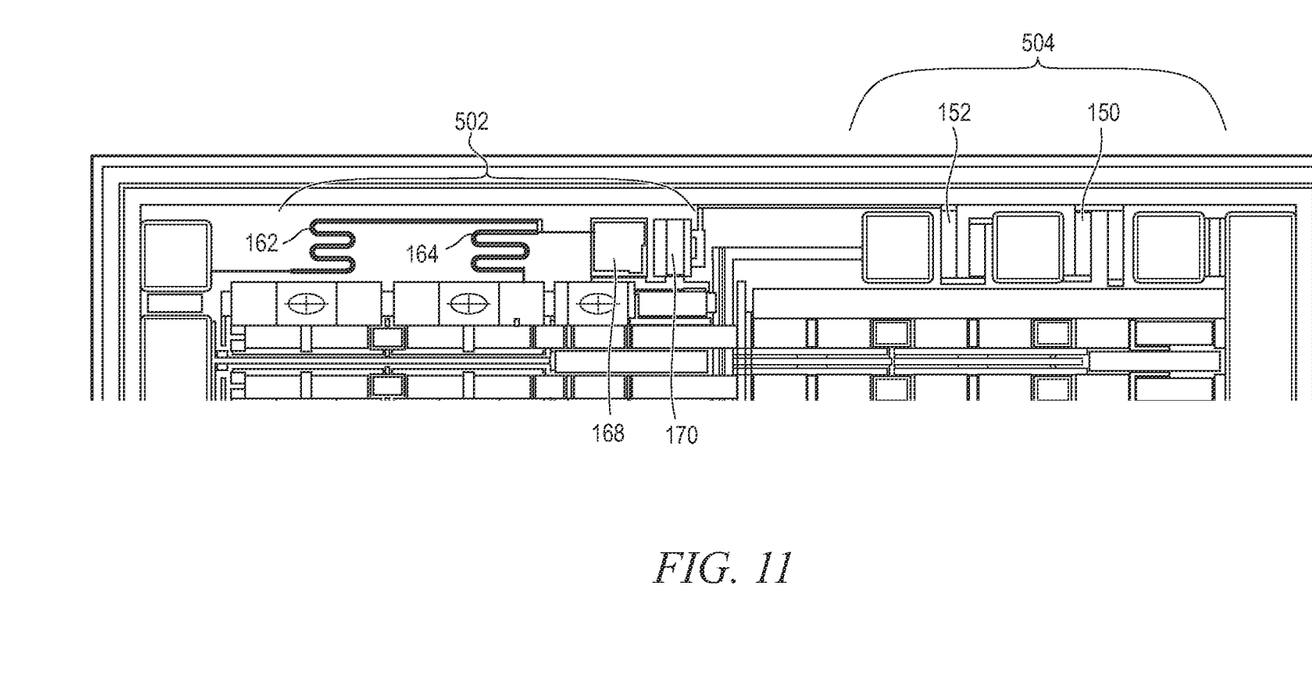
FIG. 11 illustrates a portion of the layout of the high voltage power amplifier containing multiple amplifier cells.

FIG. 11 illustrates further detail of a portion of layout 490. Area 502 is the location of the shutdown circuit. For example, shutdown circuit 160 from FIG. 2 would have resistors 162 and 164, capacitor 168, and transistor 170. Resistors 150 and 152 from bias network 154 are shown in area 504 of layout 490.

While one or more embodiments of the present invention have been illustrated in detail, the skilled artisan will appreciate that modifications and adaptations to those embodiments may be made without departing from the scope of the present invention as set forth in the following claims.

What is claimed:

1. An amplifier, comprising:
   an amplifier cell including an input terminal adapted for receiving an input signal and an output terminal adapted for providing an output signal;
   a bias network coupled to the output terminal and providing a bias signal to the amplifier cell; and
   a shutdown circuit coupled to the input terminal of the amplifier cell and further coupled to the bias network to disable the bias network in response to a non-assertion of the input signal and to enable the bias network in response to an assertion of the input signal.

2. The amplifier of claim 1, wherein the shutdown circuit includes a transistor comprising a first conduction terminal coupled to the bias network, a second conduction terminal coupled to a power supply terminal, and a control terminal coupled to the input terminal.

3. The amplifier of claim 2, wherein the shutdown circuit further includes:
   a first resistor comprising a first terminal coupled to the input terminal; and
   a second resistor comprising a first terminal coupled to a second terminal of the first resistor at a first node, and a second terminal coupled to the power supply terminal, wherein the control terminal of the transistor is coupled to the first node.

4. The amplifier of claim 3, wherein the shutdown circuit further includes a capacitor coupled between the first node and the power supply terminal.

5. The amplifier of claim 2, wherein the bias network includes:
   a first resistor comprising a first terminal coupled to the output terminal; and
   a second resistor comprising a first terminal coupled to a second terminal of the first resistor, wherein a second terminal of the second resistor is coupled to the first conduction terminal of the transistor.

6. The amplifier of claim 1, wherein the amplifier cell includes:
   a first transistor comprising a first conduction terminal coupled to a power supply terminal, and a control terminal coupled to the input terminal; and
   a second transistor comprising a first conduction terminal coupled to a second conduction terminal of the first transistor, a second conduction terminal coupled to the output terminal, and a control terminal coupled to the power supply terminal.

7. A semiconductor device including an amplifier, comprising:
   a first amplifier cell including an input terminal adapted for receiving a first input signal and an output terminal adapted for providing a first output signal;
   a bias network coupled to the output terminal of the first amplifier cell; and
   a shutdown circuit coupled to the input terminal of the amplifier cell and further coupled to the bias network to disable the bias network in response to a non-assertion of the first input signal.

8. The amplifier of claim 7, wherein the shutdown circuit includes a transistor comprising a first conduction terminal coupled to the bias network, a second conduction terminal coupled to a power supply terminal, and a control terminal coupled to the input terminal of the first amplifier cell.

9. The amplifier of claim 8, wherein the shutdown circuit further includes:
   a first resistor comprising a first terminal coupled to the input terminal of the first amplifier cell; and
   a second resistor comprising a first terminal coupled to a second terminal of the first resistor at a first node, and a second terminal coupled to the power supply terminal, wherein the control terminal of the transistor is coupled to the first node.

10. The amplifier of claim 9, wherein the shutdown circuit further includes a capacitor coupled between the first node and the power supply terminal.

11. The amplifier of claim 8, wherein the bias network includes:
    a first resistor comprising a first terminal coupled to the output terminal of the first amplifier cell; and
    a second resistor comprising a first terminal coupled to a second terminal of the first resistor, wherein a second terminal of the second resistor is coupled to the first conduction terminal of the transistor.

12. The amplifier of claim 7, wherein the first amplifier cell includes:
    a first transistor comprising a first conduction terminal coupled to a power supply terminal, and a control terminal coupled to the input terminal of the first amplifier cell; and
    a second transistor comprising a first conduction terminal coupled to a second conduction terminal of the first transistor, a second conduction terminal coupled to the output terminal of the first amplifier cell, and a control terminal coupled to the power supply terminal.

13. The amplifier of claim 7, further including a second amplifier cell including an input terminal adapted for receiving a second input signal and an output terminal adapted for providing a second output signal, wherein the input terminal of the second amplifier cell is coupled to the input terminal of the first amplifier cell and the output terminal of the second amplifier cell is coupled to the output terminal of the first amplifier cell.

14. A method of making a semiconductor device including an amplifier, comprising:

providing a first amplifier cell including an input terminal adapted for receiving a first input signal and an output terminal adapted for providing a first output signal;

providing a bias network coupled to the output terminal of the first amplifier cell; and providing a shutdown circuit coupled to the input terminal of the amplifier cell and further coupled to the bias network to disable the bias network in response to a non-assertion of the first input signal.

15. The method of claim 14, wherein providing the shutdown circuit includes providing a transistor comprising a first conduction terminal coupled to the bias network, a second conduction terminal coupled to a power supply terminal, and a control terminal coupled to the input terminal of the first amplifier cell.

16. The method of claim 15, wherein providing the shutdown circuit further includes:

providing a first resistor comprising a first terminal coupled to the input terminal; and providing a second resistor comprising a first terminal coupled to a second terminal of the first resistor at a first node, and a second terminal coupled to the power supply terminal, wherein the control terminal of the transistor is coupled to the first node.

17. The method of claim 16, wherein providing the shutdown circuit further includes providing a capacitor coupled between the first node and the power supply terminal.

18. The method of claim 15, wherein providing the bias network includes:

providing a first resistor comprising a first terminal coupled to the output terminal of the first amplifier cell; and providing a second resistor comprising a first terminal coupled to a second terminal of the first resistor, wherein a second terminal of the second resistor is coupled to the first conduction terminal of the first transistor.

19. The method of claim 14, wherein providing the first amplifier cell includes:

providing a first transistor comprising a first conduction terminal coupled to a power supply terminal, and a control terminal coupled to the input terminal of the first amplifier cell; and providing a second transistor comprising a first conduction terminal coupled to a second conduction terminal of the first transistor, a second conduction terminal coupled to the output terminal of the first amplifier cell, and a control terminal coupled to the power supply terminal.

20. The method of claim 14, further including providing a second amplifier cell including an input terminal adapted for receiving a second input signal and an output terminal adapted for providing a second output signal, wherein the input terminal of the second amplifier cell is coupled to the input terminal of the first amplifier cell and the output terminal of the second amplifier cell is coupled to the output terminal of the first amplifier cell.

21. The method of claim 14, wherein the shutdown circuit enables the bias network in response to an assertion of the first input signal.

22. The amplifier of claim 1, wherein the shutdown enables the bias network in response to a direct current (DC) component of the input signal.

23. The amplifier of claim 7, wherein the shutdown circuit enables the bias network in response to an assertion of the first input signal.

* * * * *